United States Patent [19]

Brandstetter

[11] Patent Number: 5,005,946
[45] Date of Patent: Apr. 9, 1991

[54] MULTI-CHANNEL FILTER SYSTEM

[75] Inventor: Robert W. Brandstetter, Levittown, N.Y.

[73] Assignee: Grumman Aerospace Corporation, Bethpage, N.Y.

[21] Appl. No.: 334,593

[22] Filed: Apr. 6, 1989

[51] Int. Cl.[5] .................... G02B 27/42; G02F 1/11; G06E 3/00; G03H 1/10
[52] U.S. Cl. .................. 350/162.12; 350/3.67; 350/3.82; 350/358; 364/822
[58] Field of Search ............... 350/162.12, 358, 169, 350/170, 173, 3.68, 3.82, 3.67, 384, 162.13, 162.14; 364/822, 825, 827; 356/347, 348, 349; 324/77 K

[56] References Cited

U.S. PATENT DOCUMENTS

| | | | |
|---|---|---|---|
| 2,451,465 | 10/1948 | Barney | 250/41.5 |
| 2,643,286 | 6/1953 | Huruitz | 175/183 |
| 3,055,258 | 9/1962 | Huruitz | 88/14 |
| 3,088,113 | 4/1963 | Rosenthal | 343/17.1 |
| 3,204,248 | 8/1965 | Alexander | 346/108 |
| 3,220,003 | 11/1965 | Montague, III et al. | 343/17.2 |
| 3,302,027 | 1/1967 | Fried et al. | 250/199 |
| 3,355,579 | 11/1967 | Robertson | 235/181 |
| 3,430,047 | 2/1969 | Hurkamp | 250/199 |
| 3,430,240 | 2/1969 | Loesch | 343/17.2 |
| 3,482,102 | 12/1969 | Thomas | 250/201 |
| 3,636,330 | 1/1972 | Holeman et al. | 253/150.27 |
| 3,671,106 | 6/1972 | Groh | 350/162 SF |
| 3,698,787 | 10/1972 | Mueller et al. | 350/3.79 X |
| 3,699,347 | 10/1972 | Buchan et al. | 250/217 R |
| 3,700,902 | 10/1972 | Buchan et al. | 350/162 SF |
| 3,816,735 | 6/1974 | Bromley | 235/181 |
| 3,821,548 | 6/1974 | Jernigan | 250/216 |
| 3,977,771 | 8/1976 | Horner | 350/162 SF |
| 4,060,316 | 11/1977 | Pollack et al. | 353/20 |
| 4,071,907 | 1/1978 | Casarent | 364/822 |
| 4,108,538 | 8/1978 | Felstead | 350/162 SF |
| 4,365,310 | 12/1982 | Green | 364/822 |
| 4,421,379 | 12/1983 | Grumet et al. | 350/3.72 |
| 4,468,093 | 8/1974 | Brown | 350/162.12 |
| 4,522,466 | 6/1985 | Lindig et al. | 350/162.2 |
| 4,531,196 | 6/1985 | Lin | 364/827 |
| 4,531,197 | 6/1985 | Lin | 350/358 X |
| 4,569,588 | 2/1986 | Nishiwaki et al. | 356/28.5 |
| 4,597,630 | 7/1986 | Brandstetter et al. | 350/3.83 |
| 4,645,300 | 2/1987 | Brandstetter et al. | 350/162.2 |
| 4,699,466 | 10/1987 | Brandstetter et al. | 350/162.2 |
| 4,884,867 | 12/1989 | Brandstetter et al. | 364/827 X |
| 4,906,069 | 3/1990 | Brandstetter et al. | 350/162.12 |

Primary Examiner—Bruce Y. Arnold
Assistant Examiner—David R. Parsons
Attorney, Agent, or Firm—Scully, Scott, Murphy & Presser

[57] ABSTRACT

A multi-channel filter which exploits the parallel processing advantages of an optical signal processor is used to sort, classify and remove noise or unwanted signals from signals of interest. This filter shall perform real time parallel signal processing to effectively channelize and remove unwanted spectra from the various signals of interest in a dense radio frequency environment. This would in effect transform a single channel that is corrupted with unwanted signals, interference and noise, to a number of discrete channels which are spectrally tailored to selected signals of interest. The filtering process is accomplished by modulating a laser carrier with the given signal of interest and performing all filtering functions optically and then down converting the filtered signal back into its original radio frequency for further use.

34 Claims, 3 Drawing Sheets

ARRANGEMENT OF
LC FINGERS

LIQUID
CRYSTAL
FINGERS

MULTI-CHANNEL FILTER SYSTEM

BACKGROUND OF THE INVENTION

1. Field of the Invention

This invention relates to optical information processing, and more particularly, to the spectral sorting and classification of radio frequency signals and the removal and adaptive excision of unwanted spectra.

2. Discussion of the Prior Art

A given signal waveform can consist of the signal of interest and interference. The signal and interference composite is a current or voltage waveform which is a function of time. Usually, only the signal, without interference, is of concern, and more specifically, only certain frequencies of the given signal are of concern; therefore, it is necessary to somehow extract the useful information and isolate the desired frequencies from the composite signal. The process of obtaining the desired signal is accomplished through filtering of the given waveform. In addition to filtering the given signals, it is also desirable to sort and classify a broad range of signals. The process of sorting and classifying signals of interest is made easier by the filtering process in that the signal can be more easily classified without corrupting interference.

Broadband receivers often have to function in dense signal and noise environments. The job of a filtering system/receiver is to sort, classify and remove unwanted signals from the signals of interest (SOI). To enhance this function it would be highly desirable to perform real-time parallel signal processing to effectively channelize and remove unwanted spectra from the SOI's. This would in effect transform a single channel that is corrupted with unwanted signals, interference and noise to a specific number of discrete channels where each is spectrally tailored to selected SOI's. In addition, it would be highly desirable to adaptively excise temporally and spectrally changing inband interferers (spectra riding on top of the SOI) which adversely effect the demodulation of the SOI.

The accepted practice has been to electronically filter the given signals. It has been found, however, that electronic filtering means have a number of distinct disadvantages. Inherent in electronic filters is the problem of phase distortion and non-linear effects. In addition, electronic filters are also susceptable to noise corruption; therefore, other techniques such as optical filtering of signals have increasingly become of interest.

The prior art shows a number of examples of optical systems for the detection and/or removal of noise and unwanted frequencies from given SOI's. U.S. Pat. No. 4,645,300, assigned to the same assignee as the present invention, discloses a Fourier Plane Recursive Optical Filter which is used to recursively pass a given signal beam a multiplicity of times through a single optical spatial filter such that the attenuation of unwanted signal frequencies is multiplied. However, the aforementioned invention does not exploit the advantages of parallel processing. U.S. Pat. No. 4,699,466, assigned to the same assignee as the present invention, discloses an optical RF Filtering System which is used to optically notch out selected electromagnetic interference, provide parallel processing in the filtering function, provide adaptive filtering techniques and to eventually down convert signals of interest to their original radio frequencies. However, the aforementioned invention does not offer spectral correlation information for channelized spectral analysis and time domain signals associated with the signals of interest. U.S. Pat. No. 4,597,630, assigned to the same assrgnee as the present invention, discloses a means and method for Self-Derived Reference Beam Holography Using A Dove Prism. This invention provides a method and associated apparatus for recording the optical interference between two light beams, which permits real time recording of the resultant interference pattern. The resulting interference pattern can thus be used to spectrally correlate incoming electromagnetic radiation signals of various frequencies. However, the aforemention invention does not exploit the advantages of parallel processing, nor does it provide for the attenuation and excision of unwanted signal frequencies.

The present invention solves the problems and limitations of the prior art by providing applications for the multi-channel, real-time sorting and filtering of signals of interest, fabrication of virtually all types of radio frequency filters, and providing for the ability to make rapid changes to the system architecture. There is a need, therefore, for a multi-channel filter system which provides for the spectral sorting and classification of radio frequency signals and the removal and adaptive excision of unwanted spectra in real time.

SUMMARY OF THE INVENTION

The present invention is directed to a multi-channel filter system for processing large numbers of signals in real time by modulating a coherent optical radiation beam with incoming radio frequency signals, channelizing these signals and providing various forms of filtering. The incoming radio frequency signals are modulated onto a carrier laser beam by means of an acousto-optic modulator. The resulting modulated radio frequency signals are Fourier transformed and channelized to produce nxm number of discrete channels of the radio frequency spectra. The nxm channels of the radio frequency spectra are then passed through a beam splitting means in order to create an array of signal beams and an array of reference beams for recording nxm interferometric patterns on a single photo-optic element which after recording serves as a holographic filter for specified signals of interest, selectively passing and rejecting spectral components defined by the holographic recording. Once the holographic recording is complete, or if it was done off site, a shutter is used to block the reference beam array so that only the signal beam array is passed on. The signal beam, which is the radio frequency spectra, is then passed through an adaptive notching filter. The adaptive notching filter is used to adaptively notch out high level narrow band interferers thus providing the signal of interest output with minimum inband interference. The radio frequency spectra, excised of narrow band interferers is then passed through the aforementioned multiple holographic filter to spectrally correlate the radio frequency signals. The order in which the radio frequency spectra is filtered and correlated does not affect the outcome; therefore, the spectral correlation could be done before the adaptive notching. The filtered and spectrally correlated signals are then down converted to their original radio frequencies by means of optical heterodyning.

The multi-channel filter system of the present invention provides for the detection and classification of an incoming band of signals by dedicating an optical channel for each specific SOI intercept. In addition, by incorporating an intergral optical notching filter, inband narrow band interferers will be adaptively excised from the SOI spectra thus improving detection and subsequent demodulation. The multi-channel filter of the invention insures 100 percent SOI intercept probability while performing needed spectral filtering and narrow band interferer excision functions.

The invention provides a new and practical means to filter and process large numbers of signals within a relatively small volume, requiring low weight and power. Specifically, the multi-channel filter offers applications in multi-channel, real-time sorting and filtering of SOI's, fabrication of virtually all types of radio frequency filters and rapid changes to system architecture.

The multi-channel filter can be used for intelligence gathering and recording, for sorting and filtering through radio frequency spectra to reduce bottlenecks in downstream serial processing and for removal of adjacent and co-channel interference. In addition, the recorded holographic filters can be distributed for general intelligence use and threat detection systems of the present invention.

BRIEF DESCRIPTION OF THE DRAWINGS

For the purpose of illustrating the invention, there is shown in the drawings the forms which are presently preferred; however, it should be understood that the invention is not necessarily limited to the precise arrangements and instrumentalities here shown.

DESCRIPTION OF THE PREFERED EMBODIMENT

The multi-channel filter system of the present invention optically filters and classifies incoming radio frequency (RF) signals by dedicating a channel for each specific signal of interest (SOI), adaptively notching out noise and spectrally correlating the signals. The spectral correlation is performed by a holographic power spectrum filter that may be fabricated in the multi-channel filter system. A beam of substantially coherent light is modulated by a spectrum of RF SOI's and transformed into the Fourier domain. The modulated light beam is channelized into a plurality of channels, each corresponding to a preselected RF spectral component of the spectrum of interest. The channels, in the form of a light array, are split-into a signal and reference array to holographically record the resulting interference patterns on a photo-optical element. The holographic recording acts as a multi-channel spectrum filter that selectively passes light corresponding to the individual spectral components of interest. Alternatively, the spectrum filter may be prerecorded and inserted into the system.

With the power spectrum filter in place, incoming RF signals can be classified and filtered. The coherent light beam carrier, modulated by the incoming RF spectrum, is Fourier transformed and channelized. The channelized array is passed through the beam splitter and a shutter blocks the reference beam so that only the signal beam illuminates the power spectrum filter. The power spectrum filter passes only those components of the incoming spectrum that correspond with the SOI's as recorded in the spectrum filter. An adaptive notching filter may be positioned upstream of the power spectrum filter to notch out unwanted noise or interferers from the reference beam. The adaptive notching filter may also be positioned downstream of the power spectrum filter to notch out the unwanted signals after the light array passes through the power spectrum filter. The output of the power spectrum filter is then inverse Fourier transformed and down converted by an array of photodetectors to an array of RF signals that have been classified and filtered in real time.

Figure 1:
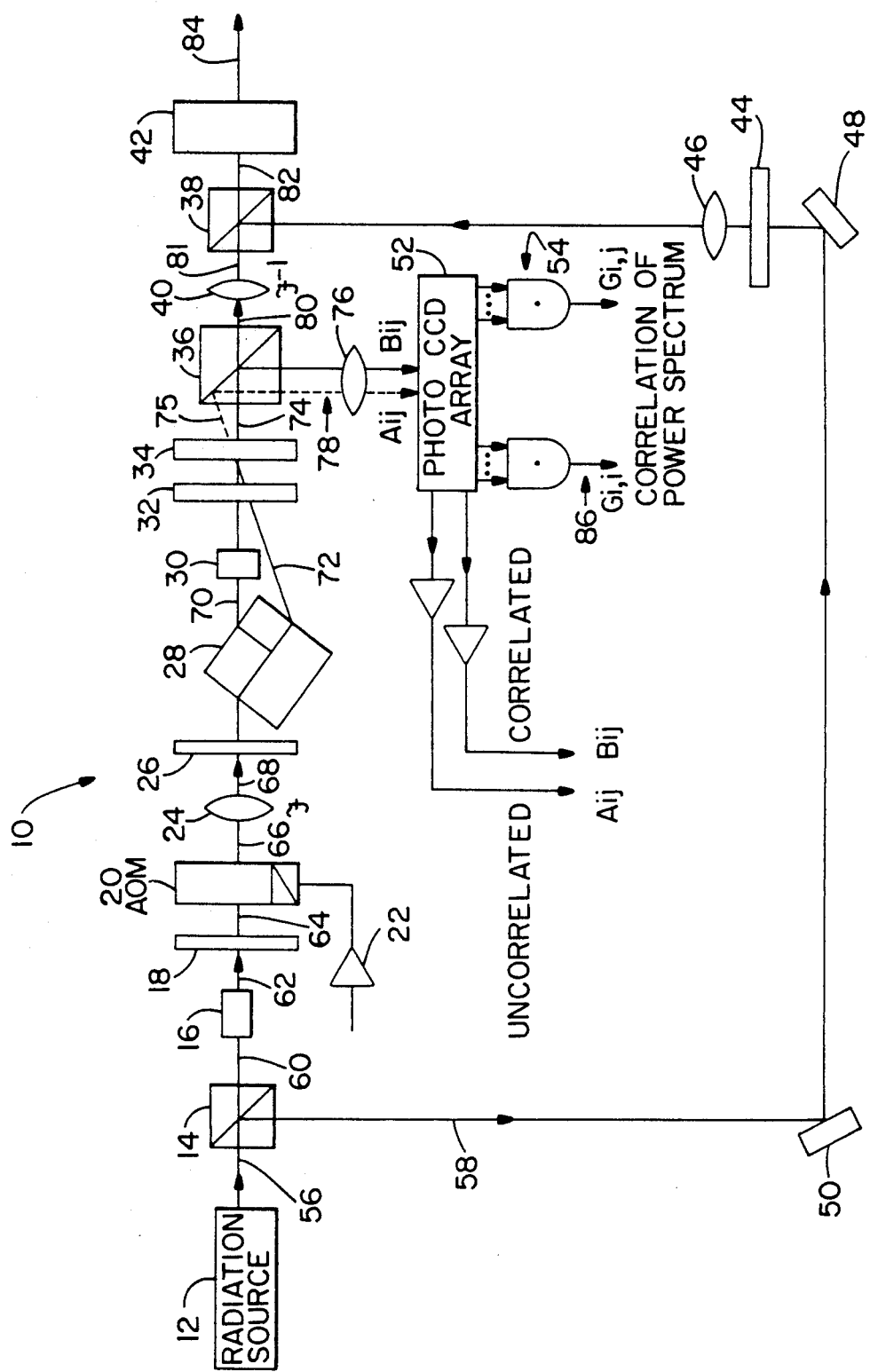
FIG. 1 is a block diagram of the multi-channel filter system of the present invention.

Referring now to FIG. 1, there is shown a schematic diagram illustrating the multi-channel filter 10 architecture. The system is comprised of an electromagnetic radiation source 12, an anamorphic beam expander 16, two wave plates 18 and 26 to adjust the polarization of the incoming radiation, an acousto-optic modulator (AOM) 20, an amplifier 22, two nxm multiple holographic lenses (MHL) 24 and 46, an integrated cube 28, a shutter 30, an adaptive notching filter (ANF) 32, a power spectrum filter (PSF) 34, two beam splitters 14 and 36, a beam combiner 38, a single element hololens 40, a photomixer array 42, a gradient density filter 44, an imaging lens 76, two mirrors 48 and 50, a photo CCD array 52, and a logic device 54.

The electromagnetic radiation source 12 produces a substantially coherent electromagnetic radiation wave or light beam 56 with a given wavelength. The electromagnetic radiation source 12 can be a gas laser such as a helium neon gas laser or a semioonductor laser such as a laser diode. Operating efficiency is greater with single-frequency laser operation which can be obtained with most semiconductor lasers, or if a gas laser is used that does not provide acceptable single-frequency laser operation, an intra or extra cavity Fabry Perot device is added.

The substantially coherent electromagnetic radiation light beam 56 is passed through the first beam splitter 14 in order to produce two beams from the one incoming beam. Alternatively, the zero order of the AOM 20 can be extracted at the output of the AOM 20 and used as the local oscillator beam 58. A description of the operation of the AOM 20 is given in subsequent paragraphs. One beam is to be used as a local oscillator beam 58 in the down conversion process, and the second beam 60 is to be used as the carrier beam. The down conversion process shall be explained more completely in subsequent paragraphs. The carrier beam 60 is then focused onto an anamorphic beam expander 16 in order to properly shape the carrier beam 60. The anamorphic beam expander 16 is a device made up of multiple prisms at pre-determined angles in order to cause anamorphic distortion. Alternatively, the expansion can be obtained using a cylinder lenses. The expanded beam 62 is then passed through a wave plate 18 in order to adjust the polarization of the incoming expanded beam 62 to produce favorable entrance conditions to the AOM 20. It should be noted that the various components of the multi-channel filter system affect the polarization of the radiation; therefore, it is necessary to maintain the equivalent polarization throughout the device in order to ensure proper down conversion. The properly polarized radiation beam 64 is then directed into the AOM 20.

The AOM 20 is a complex light modulator which transforms a radio frequency signal to an acoustic wave which modulates the refractive index of an optical material, thereby producing a phase modulated medium manifested by a structure of compressions and rarefactions periodic with the radio frequency signal. This modulated medium appear to the incident laser beam as a dynamic phase grating which produces a first order signal, and depending upon operating regions sometimes higher orders, emerging as an exciting beam where angular deflection is proportional to the radio frequency signal. When light from a radiation source is transmitted at an appropriate angle through a medium which is transparent to light and through which an ultrasonic wave is propagated and the refractive index of the medium is varied periodically with time, the light is diffracted. At this time, the frequency of the light beam is shifted by the number of vibrations of the ultrasonic wave. This is accomplished when the incoming RF signal produces an electric field across a transducer (i.e. piezoelectric crystal transducer, PZT) which creates a strain proportional to the incoming RF signal. This strain is the aforementioned ultrasonic wave. The result most closely resembles a narrow band phase modulated signal. The present invention uses a Bragg Cell for imposing the RF signal spectral intelligence on the carrier beam 64 in the form of narrow beam phase modulation. If a Bragg Cell is used for the AOM 20, it typically comprises an optical medium such as crystal element driven by an appropriate transducer (i.e., PZT) in a known manner. A further description of the AOM 20 is given in U.S. Pat. No. 4,699,466 assigned to the same assignee as the present invention and incorporated herein by reference. The RF signal is brought into the AOM 20 by an RF amplifier 22.

The output of the AOM 20 is a narrow band phase modulated beam 66. This modulated beam is directed to and incident upon the nxm multiple holographic lens (MHL) 24. The MHL 24 is fabricated in a known manner such as that described in U.S. Pat. No. 4,421,379 assigned to the same assignee as the present invention. The MHL 24 provides nxm number of distinct channels of the the modulated beam 66.

In addition, the MHL 24 performs an optical Fourier transform of the incident modulated beam 66, thus producing nxm channels of the spectra of the original incoming RF signal. The Fourier transform of a signal gives the relative level of one frequency as compared to another. The mathematical representation of the Fourier transform of a given signal, w(t), is given by $$W(F) = F[w(t)] = \int_{-\infty}^{\infty} w(t)e^{-j2\pi ft}dt. \quad (1)$$

It should be noted that the above equation for the Fourier transform is a mathematical model used to illustrate the conversion process. The actual conversion is done optically and is well known in the art. The reason the modulated beam or signal is transformed into the frequency domain is based on the fact that theoretically, in order to evaluate the signal frequencies that are present, one needs to view the signal waveform over all time. This is done in order to ensure that no frequencies are neglected, and the Fourier transformed signal gives a good representation of the relative frequencies.

The nxm array of transformed beams or RF spectra 68, now in the spatial frequency domain, are then directed and incident upon an integrated cube 28 after passing through the second wave plate 26. The integrated cube 28 is a beam splitting means for supplying a signal beam array 72 and a reference beam array 70 for creating holographic filters.

The use of an integrated cube to make self-derived holographic recordings is described in U.S. Pat. No. 4,597,630 assigned to the same assignee as the present invention and incorporated herein by reference. Briefly, the process involves splitting the modulated beam into a pair of component beams, both derived from the modulated beam, and reflecting the resultant split beams towards each other so as to interfere optically. The beam splitting and reflecting are effected by the integrated cube 28 which is essentially a transparent element. A recording of the interference is made by positioning a photosensitive medium at the plane of interference. In one mode of operation of the multi-channel filter system of the present invention, the integrated cube 28 is used to generate the interference pattern of the RF spectrum of interest to fabricate the power spectrum filter 34 in situ which will be described in more detail hereinafter. Subsequently, the system is driven by an incoming RF spectrum to be analyzed. In this mode, a blocking element or shutter 30 is positioned to block transmission of the reference beams so that only the signal beam array 72 illuminates the PSF 34 to produce a correlated output.

Figure 2:
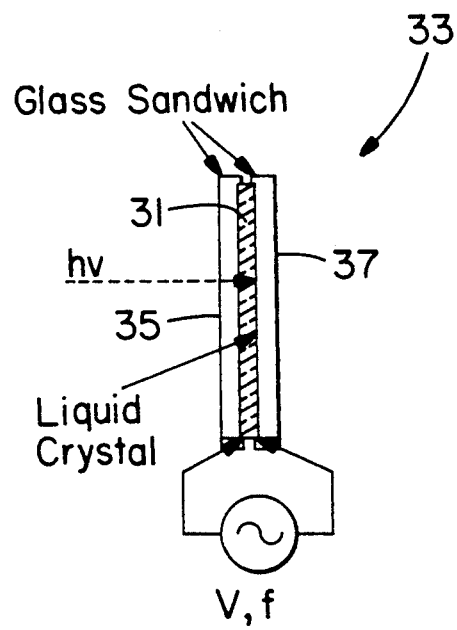
FIG. 2 is a schematic sideview of an adaptive notching filter made with a liquid crystal light value.

As shown in FIG. 1, the signal beam array 72 is focused onto an adaptive notching filter (ANF) 32 positioned upstream of the PSF 34 for filtering out noise from incoming RF signals. Referring to FIG. 2, there is shown one embodiment in which the ANF 32 is a liquid crystal light valve (LCLV) 33. The LCLV 33 consists of liquid crystal material 31 sandwiched between glass plates 35 and 37 with transparent electrodes (not shown) and photoconductive surface. The photoconductivity is varied by the intensity of the incident light; however, by suitable biasing of the LCLV 33 with excitation voltage and frequency, the device can be made to operate in a non-linear region for superior results.

Figure 3:
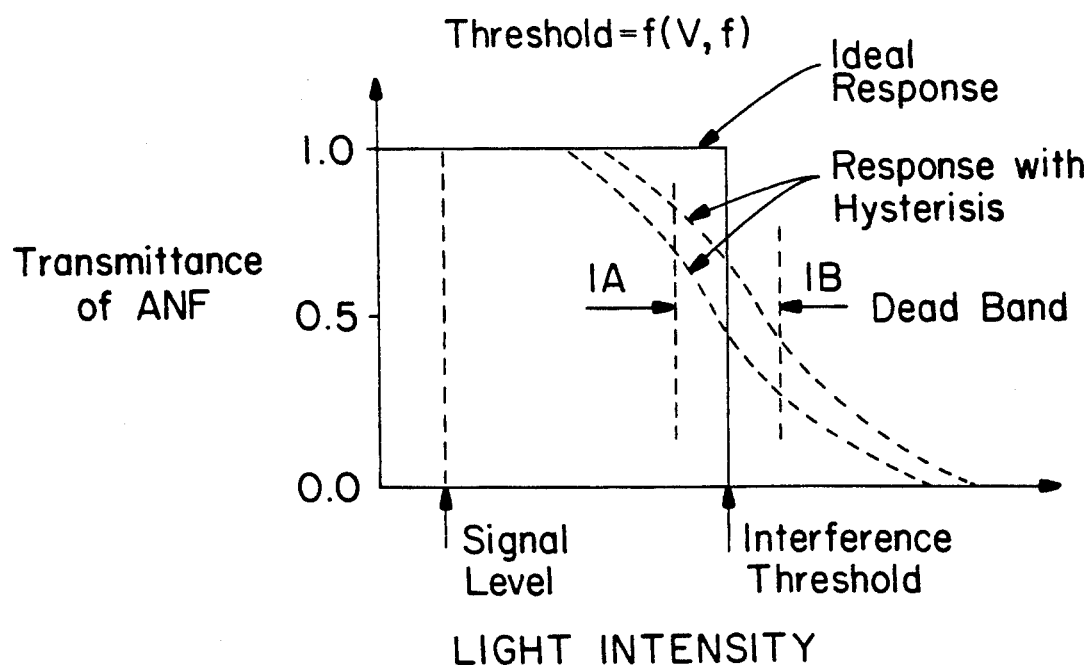
FIG. 3 is a graph showing the operation of the liquid crystal light value of FIG. 2.

In the ideal case, as is shown in FIG. 3, the on/off operation for the LCLV is binary. In other words, directly switching from maximum to minimum transmittance. In the non-ideal case the transmittance falls off less abruptly and also exhibits hysterisis. This means that for a given interferer intensity level, the LCLV will turn on at some level and turn off at a different level. This dead band and gradual turn on/turn off is adjustable by varying the excitation voltage and frequency of the LCLV as mentioned earlier.

Referring back to FIG. 1, the ANF 32, excises high level narrow band interferers from incoming signals. The signals of interest with high level narrow band interferers (NBI's) are incident on the ANF 32. The intensity of the NBI's is above the preset threshold of the LCLV 33. This intensity above threshold creates photoconduction transferring the electric field dominantly across the liquid crystal causing it to respond with a phase disturbance in the region. At the photomixer array 42 (part of the down conversion process) this disturbance will prevent the NBI from coherently down converting thus forming notches in the spectrum where each NBI is located. In other words, the ANF 32 intercepts the spatial carrier and depending upon the intensity of the optical beam. blocks or passes this spatial carrier. By proper biasing of the LCLV 33, the ANF 32 can filter the signal beam array 72 to produce a plurality of differently shaped output signals.

Figure 4:
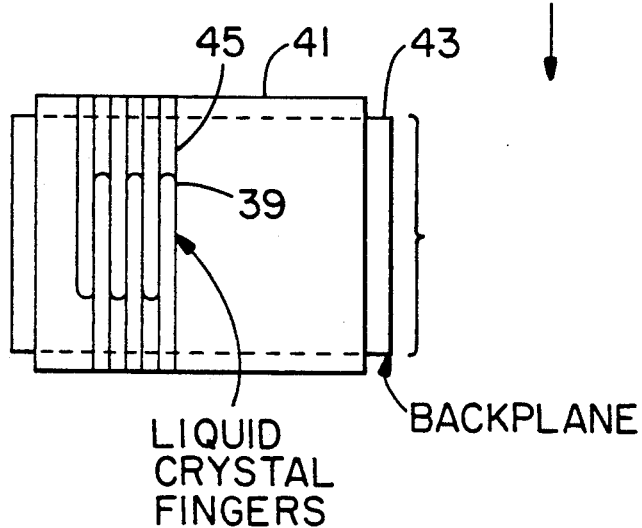
FIG. 4 is a schematic view of an adaptive notching filter in an addressable programmable architecture.

The above described embodiment for the ANF 32 operates on the assumption that since for the majority of cases the interferers are ten to a hundred times that of the signal, the dead band and hysterisis would not pose a problem for normal signal operation. However, in instances where the interferers and signal are of comparable level, the lack of amplitude discrimination would dictate the need for a different type of ANF. One embodiment of the ANF 32 useful where interferers and signals are of commensurate amplitude is an electrically addressable ANF architecture as shown FIG. 4. The ANF of FIG. 4 is composed of a liquid crystal material 39 sandwiched between glass plates 41 and 43 which have transparent tin oxide electrodes 45 deposited on the inner surfaces. Electrodes 45 are fanned out for interfacing with a printed circuit card not shown. Glass plate 43 is called the back plane which is a continuous and uniform deposition of transparent tin oxide. Different types of liquid crystal materials are available to obtain a variety of effects. This embodiment of the ANF is a comb filter where each tooth corresponds to an element of the ANF. The elements can be activated to block a signal or deactivated to pass the signal. In this embodiment, each channel of the ANF 32 is specifically tailored for each incoming signal of interest. Specifically, the pass characteristics of the ANF 32 can be formed for narrowband, baseband, discontinuous and disjoint spectra as well as for notching or passing spectral bands. In either embodiment, the ANF 32 can be reconfigured or re-programmed in near real-time (as fast as photoconductive surface's permit) either remotely or on site.

Once again referring to FIG. 1, the signal spectrum array 72 minus the NBI's are then incident upon the power spectral filter (PSF) 34. The PSF 34 is a filter in which a holographic power spectrum has been recorded in situ by use of the integrated cube 28 or previously recorded by some other means. Each incoming signal frequency produces a unique holographic power spectral recording or fringe pattern. The PSF 34 used in the present invention has nxm distinct patterns for filtering each of the nxm signals in the signal beam array 72. The PSF 34 passes only spectra in common with the input RF signal spectra. The spectra in common with the input RF signal is the correlated signal spectrum array 74 and the spectra not in common is the uncorrelated array 75 and passes directly through the PSF 34 undiffracted and off axis. If there is no spectral correlation, incoming spectra do not coincide with unique fringe pattern, the uncorrelated spectra do not get through to the down coversion portion of the filter, however, it does pass through the PSF 34. Spectral correlation is detection based on the averaged product of the received signal and a locally generated function possesing some given characteristic of the transmitted signal.

Figure 5:
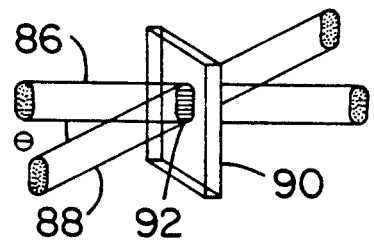
FIG. 5 is a diagram showing the method of recording a holographic power spectral filter with a laser.

The holographic power spectrum filter recording is obtained by combining the signal and reference beam arrays 72 and 70, as derived from the previously mentioned integrated cube 28, on a photosensitive material such as silver halide film, photopolymer or reusable thermal plastics. FIG. 5 shows how a holographic filter is fabricated. As shown, in the recording mode the reference and signal beams, 70 and 72 respectively, are incident on the recording medium 34 at some angle $\theta$. The two beams 70 and 72 produce a fringe pattern 86 with a line spacing, S, described in an equation given by $$S = \frac{\lambda}{2n\text{SIN}\left(\frac{\phi}{2}\right)}, \quad (3)$$

where $\lambda$ is the wavelength of incident light and n is the index of refraction of the recording medium.

FIG. 5 shows how a single fringe pattern is recorded; however, through the use of the AOM 20 and MHL 24, shown in FIG. 1, nxn fringe patterns can be recorded where each pattern represents the power spectra of a SOI. If it is desired that the PSF 34 contain nxn fringe patterns of the same frequency, then all fringe patterns can be recorded on the PSF 34 simultaneously; however, if it is desired that the PSF 34 contain nxn fringe patterns of one for each SOI spectra, then each fringe pattern is recorded individually. By blocking light from passing through all but a single channel of the MHL 24 through the use of a movable blocking element (not shown), a fringe pattern for a particular RF SOI can be recorded at a location corresponding to the particular channel of the MHL 24 that is not blocked. When the recording of the single fringe pattern is complete, the next RF SOI is introduced and the blocking element is moved to allow light to pass through the next element of the MHL 24. The process continues until the desired number of fringe patterns are recorded.

Figure 6:
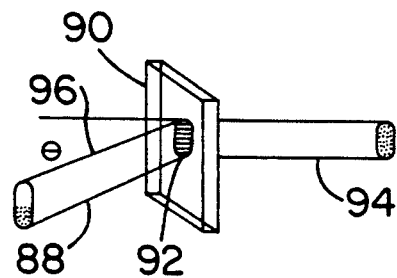
FIG. 6 is a diagram showing the operation of a holographic power spectral filter in the interrogating mode.

After recording and fixing the holographic plate, the PSF 34 can be interrogated or played back. FIG. 6 shows the PSF 34 in the playback mode. It is important to note that only the signal beam produces the correlated spectra 74. The solid single line 75 denotes the zero order term, or uncorrelated spectra, which also appears at the output, but is advantageously separated by the angle $\theta$. For the case in which there is no spectral correlation only the zero order beam will appear at the output of the PSF 34. The angular separation between the correlated and uncorrelated, spectra functions like a switch. The PSF 34 will correlate only those spectra that are holographically encoded in the filter.

There are certain conditions necessary in order to establish the proper steady interference pattern. The first condition is that both beams must have the same frequency and wavelength. The second condition is that the phase difference between the wave at the given point must not vary with time. The third condition is that the relative amplitude of the two signals must be fixed. The fourth condition is that the light signals must have the same polarization. In addition, for successful recording of the interference pattern, it is necessary that the difference in the optical path of each signal (reference and signal) must be within the coherence length of the radiation source 12. The conditions for setting up the interference patterns are well known in the art.

The recording of the filter can be accomplished by using incoming RF signals, or by using generated signals. The generated signals are clean signals without noise. Once the recording is made, it can be saved and used over again. Since there are nxm channels, each can be specifically tailored to filter different spectral distributions.

Referring again to FIG. 1, after passing through the PSF 34, the incoming signals have been channelized, adaptively filtered and excised of adjacent channel and in-channel interferers, and power spectra correlated with the holographic filter. It should be noted that each channel of the multi-channel filter can provide linear phase with a finite impulse response. Cut-off of the optical filter at any point in the response is only limited by the diffraction and scattering effects and can be controlled by the ANF 32 and the PSF 34 elements as suggested in the preceeding paragraphs. Therefore, within each channel, properties such as shape factor (slope of cutoff) and apodization (suppression of side lobes) can be selectively controlled.

The correlated signal spectra array output 74 of the PSF 34 is then incident upon the second beam splitter 36. The beamsplitter 36 provides two sets of the signal spectra array. One set 78 is focused onto an imaging lens 76 while the other set 80 is incident upon a hololens 40. The set 78 is comprised of the correlated signals, Bij, and the uncorrelated plus correlated signals, Aij. These sets of signals provide power spectral information such as would a spectrum analyzer. The set of signals 78, can be monitored, recorded or both to provide continuous broad spectrum analysis. The signals 78 can provide erasable or archival recordings of power spectrum fingerprints of SOI's which can be readily replicated for dissemenation to other multi-channel systems. Additionally, the product of the spectra Aij and Bij can be detected at photo charge-coupled device, CCD array 52, and summed by electronic post processing means 54 in order to develop a correlation function of the power spectrum. The correlation function is another tool used in signal processing which has various applications.

The CCD array 52 is composed of a linear arrangement of photsensitive CCD elements, the outputs of which are fed into a suitable sample and hold register. As in the case with the photomixer array 42, each CCD element is operatively associated preferably with a specific one of the linear liquid crystal segments of PSF 34. Each CCD element will represent some specific frequency band of the spread frequency spectrum to the RF signal imposed by the AOM on the radiation beam and will be associated with a liquid crystal segment representing the same frequency band in the PSF. U.S. Pat. No. 4,699,466 assigned to the same assignee as the present invention contains a further description of the operation of the CCD array.

The set of signal spectra 80 incident upon the hololens 40 is down converted at the photomixer array 42. The hololens 40 performs the inverse Fourier transform on the incoming spectra as the first step in the down conversion process. Given the mathematical function for the Fourier transformed signal or spectra, W(F), it is possible to obtain the mathematical representation of the time varying waveform by using $$w(t) = \int_{-\infty}^{\infty} W(F) e^{j2\pi ft} df. \quad (2)$$

As stated previously, the above equation for the inverse Fourier transform is a mathematical model used to illustrate the transform process, frequency domain to time domain. For the multi-channel filter of the present invention the transform is done optically and is well known in the art.

The beam array 81 exiting the hololens 40 then enters a beam combiner 38 where is it summed with a processed local oscillator (LO) beam 58 in order to be down converted at the photomixer array 42. The photomixer array 42 is aligned in such a way as to have each channel mated with the corresponding channel of the PSF 34. The photomixer array 42 has incident upon it the composite beam 82 made up of the local oscillator beam and inversed Fourier transformed signal. The photomixer array 42 responds as an intensity detector, squaring the sum of the light amplitude. The output of the photomixer array 42 contains dc terms proportional to each light intensity, LO and signal, and a RF term which corresponds to the difference in frequency of the LO and phase modulated radiation signal beam. The photomixer array 42 produces nxm channelized RF signals 84. The output signals 84 are available at the original radio frequencies with only the pass characteristics altered. The nxm signals 84 at the output of the photomixer array 42 are now strained of all non-correlating spectra and NBI's. The processed nxm signals 84, which are spectrally classified, can then be assessed for tactical or strategic importance in real time and thus are available for immediate retransmission or additional data reduction.

The local oscillator beam 58 derived from the first beam splitter 14 is directed to the combiner 38 by means of two mirrors 48 and 50. Before entering the combiner 38, the LO beam 58 is directed through a gradient density filter 44 (GDF). The GDF 44 is selected to control the density profile of the LO (i.e. gaussian, truncated gaussion, rectangular shapes) which shapes the LO beam. By us of the GDF 44 almost any type of pass characteristics or shape of the output signal for the filter can be obtained. After passing through the GDF 44, the LO beam 58 is then passed through another nxm MHL 46. The nxm MHL 46 provides nxm distinct LO beams that have been shaped by the GDF 44 for use in the down conversion process. In another embodiment, the GDF 44 and the nxm MHL 46 can be switched, thus providing nxm distinct channels each having its own GDF prescribed shape as opposed to each having the same shape. This is more difficult and complex due to the fact that the GDF 44 must have dissimilar characteristics.

The multi-channel filter system of the present invention provides for the identification and sorting of one or more selected signals from a broad radio frequency band. The multi-channel filter system also provides adaptive filtering and excision of adjacent channel and in-channel high level interferers as well as power spectrum correlation with holographic filter recordings. In addition, the multi-channel filter system provides for continuous broad band spectrum analysis of incoming RF signals including correlated power spectra and the correlation function of the power spectra. Recordings of these power spectrum finger prints can be made in situ and rapidly replicated for dissemination to other systems.

Although shown and described in what are believed to be the most practical and preferred embodiments, it is apparent that departures from specific methods and designs described and shown will suggest themselves to those skilled in the art and may be used without departing from the spirit and scope of the invention. The present invention is not restricted to the particular embodiments described and illustrated, but should be construed to cover all modifications that may fall within the scope of the appended claims.

I claim:

1. A multi-channel filter system comprising:

means for modulating a substantially coherent light beam with an input RF signal spectrum;

means for optically Fourier transforming and channelizing the modulated light beam to produce an input array of modulated light beams, each light beam in said input array being modulated by a spectral component of said input RF signal spectrum;

means for optically notching out noise in said input array of modulated light beams;

a holographic multi-channel spectrum filter, said spectrum filter selectively passing light beams from said input array having a correlation to preselected RF spectral components to produce a correlated output array;

means for illuminating said spectrum filter with said input array of modulated light beams to produce said correlated output array;

means for downconverting said correlated output array into an output array of noise excised and spectrum filtered RF signals; and means for detecting and for respectively converting the signals passed by said holographic multi-channel spectrum filter into electrical output signal arrays.

2. A multi-channel filter system comprising:

means for modulating a substantially coherent light beam with an input RF signal spectrum;

means for optically Fourier transforming and channelizing the modulated light beams to produce an input input array of modulated light beams, each light beam in said array being modulated by a spectral component of said input RF signal spectrum;

a holographic multi-channel spectrum filter, said spectrum filter selectively passing light beams in said input array having a correlation to preselected RF spectral components to produce a correlated output array;

means for illuminating said spectrum filter with said input array of modulated light beams to produce said correlated output array;

means for optically notching out noise in said correlated output array;

means for downconverting said correlated output array into an output array of noise excised and spectrum filtered RF signals; and means for detecting and for respectively converting the signals passed by said holographic multi-channel spectrum filter into electrical output signal arrays.

3. The filter system of claims 1 or 2 wherein said illuminating means comprises a beam-splitting means for splitting said array of modulated light beams into a signal array and a corresponding self-derived reference array, and means for selectively blocking said reference array to permit said spectrum filter to be illuminated only by said signal array for producing said correlated output array.

4. The filter system of claim 3 wherein said beam-splitting means includes means for directing said signal and reference arrays to interfere optically at a predetermined plane and further including a photo-optical element positioned essentially at said plane to holographically record said multi-channel spectrum filter in situ.

5. The filter system of claim 4 wherein said beam-splitting means comprises an integrated cube.

6. The filter system of claims 1 or 2 wherein said spectrum filter comprises a plurality of self-derived holographic recordings.

7. The filter system of claim 6 wherein said plurality of holographic recordings are comprised of an array of unique fringe patterns which are generated by the optical interference of said input array of reference laser beams and an array of modulated light beams.

8. The filter system of claims 1 or 2 wherein said spectrum filter passes all of the light beams in said input array to produce an uncorrelated output array.

9. The filter system of claim 8 further including means for detecting said correlated and uncorrelated output arrays for producing a correlation function and for recording the correlated and uncorrelated spectrum.

10. The filter system of claim 9 further including a second beam splitting means for directing a portion of said correlated output array and said uncorrelated output array to said detecting means.

11. The filter system of claims 1 or 2 wherein said modulating means comprises an acousto-optical modulator.

12. The filter system of claim 11 further including a source of said substantially coherent light beam.

13. The filter system of claim 12 wherein said source of substantially coherent light is a laser.

14. The filter system of claim 12 wherein said Fourier transform means comprises a multiple holographic lens.

15. The filter system of claims 1 or 2 wherein said downconverting means comprises
means for performing an inverse Fourier transform of said correlated output array;
means for combining said inverse Fourier transformed array with a local oscillator light beam resulting in a combined array; and
photodetector array means for detecting said combined array and producing an array of noise excised and spectrum filtered RF signals.

16. The filter system of claim 15 wherein said inverse Fourier transforming means is single element holographic lens.

17. The filter system of claim 15 further including a multiple holographic lens for refracting said local oscillator beam into an array of local osciallator light beams.

18. The filter system of claim 15 further including a gradient density filter for shaping the local oscillator beam.

19. The filter system of claim 18 further including means for deriving said local oscillator beam from said substantially coherent light beam.

20. The filter system of claims 1 or 2 wherein said detector means comprises a charged-coupled device.

21. The filter system of claims 1 or 2 wherein said optical notching means comprises a liquid crystal light valve, said liquid crystal light valve responding as an intensity detector selectively blocking light beams above a preselected threshold intensity.

22. The filter system of claims 1 or 2 wherein said optical notching means comprises a programmable optical notching filter, said programmable optical notching filter selectively passing light beams based on a programmed filter pattern.

23. A method of filtering incoming RF spectra comprising:
modulating a substantially coherent light beam with an input RF signal spectrum;
optically performing a Fourier transform and channelizing the modulated light beam to produce an input array of modulated light beams, each light beam in said array being modulated by a spectral component of said input RF signal spectrum;

optically notching out noise in said input array of modulated light beams;

filtering said input array be selectively passing light beam in said input array having a correlation to preselected RF spectral components to produce a correlated output array;

illuminating a power spectrum filter with said array of modulated light beams to produce said correlated output array;

downconverting said correlated output array into an output array of noise and spectrum filtered RF signals; and detecting and converting the signals passed by said holographic multi-channel spectrum filter into electrical output signal arrays.

24. A method of filtering incoming RF spectra comprising:

modulating a substantially coherent light beam with an input RF signal spectrum;

optically performing a Fourier transform and channelizing the modulated light beam to produce an input array of modulated light beams, each light beam in said array being modulated by a spectral component of said input RF signal;

filtering said input array be selectively passing light beam in said input array having a correlation to preselected RF spectral components to produce a correlated output array;

illuminating a power spectrum filter with said array of modulated light beams to produce said correlated output array;

optically notching out noise in said correlated output array;

downconverting said correlated output array into an output array of noise and spectrum filtered RF signals; and detecting and converting the signals passed by said holographic multi-channel spectrum filter into electrical output signal arrays.

25. The method of claims 23 or 24 wherein said illuminating step comprises splitting said array of modulated light beams into a self-derived signal array and a corresponding self-derived reference array, and selectively blocking said self-derived signal array to permit said spectrum filter to be illuminated only by said reference array for producing said correlated output array.

26. The method of claim 25 wherein said splitting step includes directing said signal and reference arrays to interfere optically at a predetermined plane and positioning a photo-optical element essentially at said plane to holographically produce said multi-channel spectrum filter in situ.

27. The method of claims 23 or 24 wherein said filtering step includes passing all of the light beams in said input array to produce an uncorrelated output array.

28. The method of claim 27 further including detecting said correlated and uncorrelated output arrays for producing a correlation function and for recording a correlated and uncorrelated spectra.

29. The method of claim 28 further including directing a portion of said correlated output array and said uncorrelated output array to said detecting means.

30. The method of claims 23 or 24 wherein said downconverting step comprises:

performing an inverse Fourier transform of said correlated output array;

combining said inverse Fourier transformed array with a local oscillator light beam; and detecting said combined array and producing an array of RF signals.

31. The method of claim 30 further including for shaping the local osciallator beam with a gradient density filter.

32. The method of claim 31 further including deriving said local oscillator beam from said substantially coherent light beam.

33. The method of claims 23 or 24 wherein said optical notching step comprises filtering said input array of modulated light beams by selectively varying an intensity threshold of a liquid crystal light valve.

34. The method of claims 23 or 24 wherein said optical notching step comprises filtering said input array of modulated light beams by programming a programmable optical notching filter to selectively notch out noise.

* * * * *